(12) United States Patent
Takano

(10) Patent No.: US 7,649,235 B2
(45) Date of Patent: Jan. 19, 2010

(54) ELECTRONIC COMPONENT PACKAGE

(75) Inventor: Atsushi Takano, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/645,614

(22) Filed: Dec. 27, 2006

(65) Prior Publication Data

US 2007/0182028 A1    Aug. 9, 2007

(30) Foreign Application Priority Data

Feb. 7, 2006    (JP)    ............................. 2006-029371

(51) Int. Cl.
*H01L 41/053* (2006.01)
(52) U.S. Cl. .................. 257/416; 257/704; 257/787; 257/E25.004; 257/E23.123; 257/E23.127
(58) Field of Classification Search .................. 257/416, 257/704, 778, 787, 789, 795, E25.004, E25.005, 257/E23.18–E23.183, E23.191, E23.193, 257/E23.116, E23.124, E23.125, E23.127, 257/E23.128; 310/313 R, 311
See application file for complete search history.

(56) References Cited

U.S. PATENT DOCUMENTS

2002/0149298 A1 * 10/2002 Furukawa et al. ........... 310/340
2004/0100164 A1 * 5/2004 Murata et al. ............... 310/348
2004/0113215 A1 * 6/2004 Shimada et al. ............. 257/414
2005/0029906 A1 * 2/2005 Miyaji ........................ 310/348
2006/0043822 A1 * 3/2006 Yokota et al. ............ 310/313 R

FOREIGN PATENT DOCUMENTS

| JP | 2004155839 A | * | 6/2004 |
| JP | 2005-045319 | | 2/2005 |
| JP | 2005-243702 | | 9/2005 |

* cited by examiner

*Primary Examiner*—Sue Purvis
*Assistant Examiner*—Leslie Pilar Cruz
(74) *Attorney, Agent, or Firm*—Wenderoth, Lind & Ponack, L.L.P.

(57) ABSTRACT

The electronic component package includes a mounting board, an electronic component and a molding resin. An external electrode is disposed on a surface of the mounting board. The electronic component connected to the mounting board via the external electrode includes a component-substrate, a device, a component-cover and a protector made of resin. The component-substrate comprising a piezoelectric body includes a first surface on which the device is disposed and a second surface opposing the first surface. The component-cover covers the first surface of the substrate and the device. The protector provided on the second surface contains filler. The molding resin covers the electronic component on the mounting board.

3 Claims, 8 Drawing Sheets

ELECTRONIC COMPONENT PACKAGE

BACKGROUND OF THE INVENTION

1. Field of the Invention

The present invention relates to an electronic component package including an electronic component such as a surface acoustic wave device or the like covered by a molding resin.

2. Background Art

Surface acoustic wave device (hereafter referred to as "SAW device") 1, an example of electronic components, includes component-substrate (hereafter referred to as "substrate") 2, interdigital transducer (hereafter referred to as "IDT") electrode 3 disposed on substrate 2, and component-cover (hereafter referred to as "cover") 4 covering substrate 2 as shown in FIG. 12. Cavity 5 is formed hermetically between IDT electrode 3 and cover 4 to keep an oscillation space for the surface acoustic waves. SAW devices 1 are formed on wafer-like substrate 2 in an aggregate of SAW devices 1, and are cut and separated into individual pieces by using rotary blade 6. Such a technology of forming the aggregate of electronic components before dicing it into pieces to produce individual electronic components is disclosed in Japanese Patent Publication of Unexamined Applications No. JP2005-45319 and No. JP2005-243702, for example.

However, when SAW device 1 mounted on mounting board 8 via external electrode 7 is molded with a cover 4 side down as shown in FIG. 13, heating sometimes causes damage on SAW device 1. The heat influences could happen in heating processes such as molding or subsequent heat cycles.

This is due to chipping of substrate 2 caused in dicing SAW device 1 by using rotary blade 6. When SAW device 1 with such chipped portions is processed for molding, molding resin 9 will penetrate into the chipped portions. Since molding resin 9 has a lower coefficient of linear expansion than substrate 2, substrate 2 contracts greater than molding resin 9 when molding resin 9 is cooled down. Consequently, cracks will start from the chipped portions on substrate 2.

SUMMARY OF THE INVENTION

The electronic component package of the present invention includes a mounting board, an electronic component and a molding resin. An external electrode is disposed on a surface of the mounting board. An electronic component connected to the mounting board via the external electrode includes a component-substrate, a device, a component-cover and a resin-made protector. The substrate composed of piezoelectric body has a first surface on which the device is disposed and a second surface opposing the first surface. The component-cover covers the first surface of the substrate and the device. The protector including filler is provided on the second surface. The molding resin covers the electronic component on the mounting board.

DETAILED DESCRIPTION OF THE INVENTION

Figure 1:
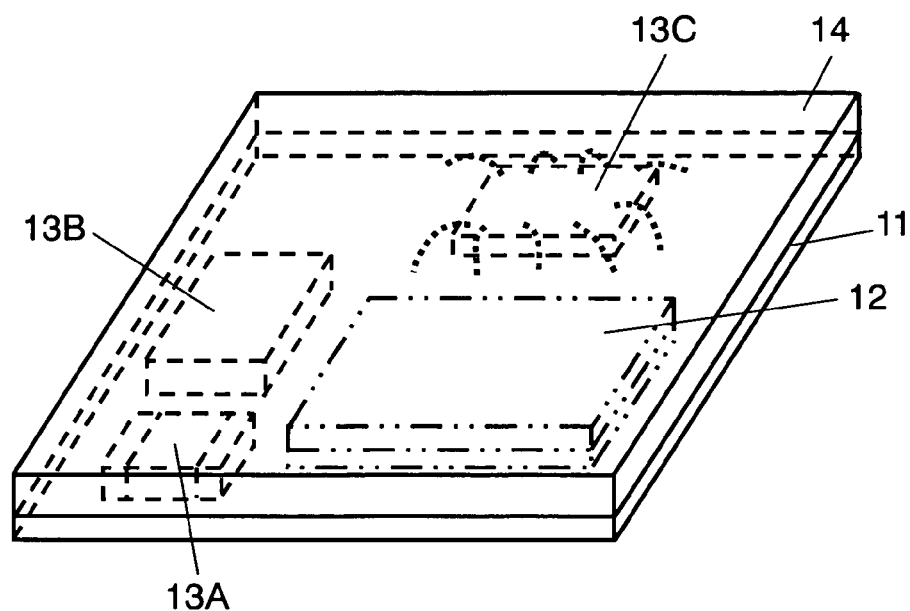
FIG. 1 shows a transparent perspective view of the electronic component package according to an exemplary embodiment of the present invention.
Figure 2:
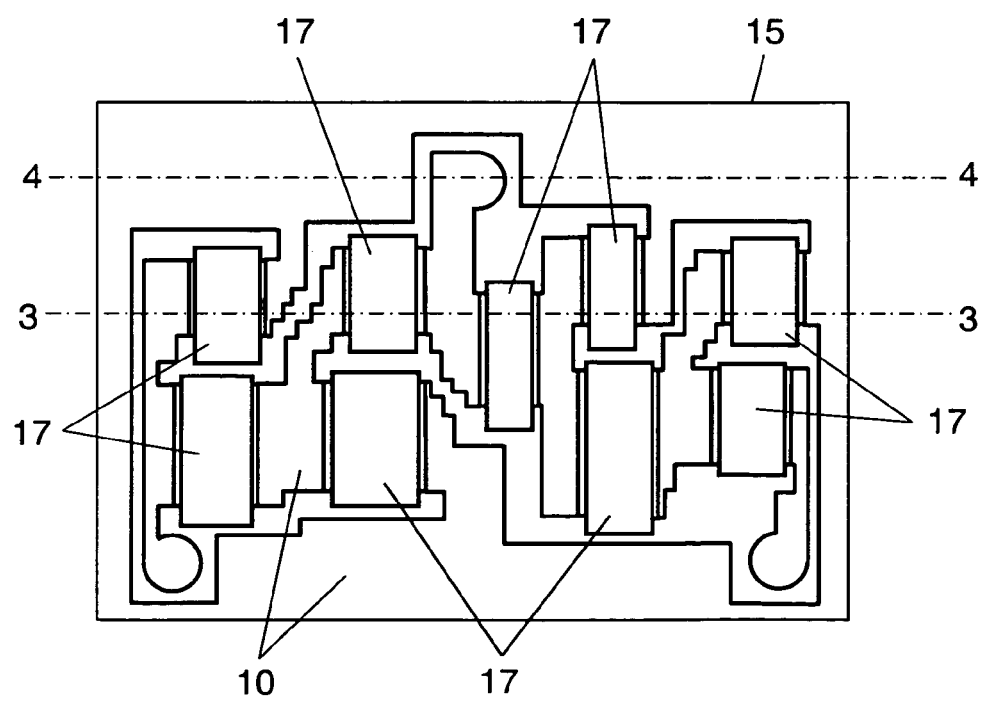
FIG. 2 shows a bottom view of a substrate of an electronic component included in the electronic component package shown in FIG. 1.
Figure 3:
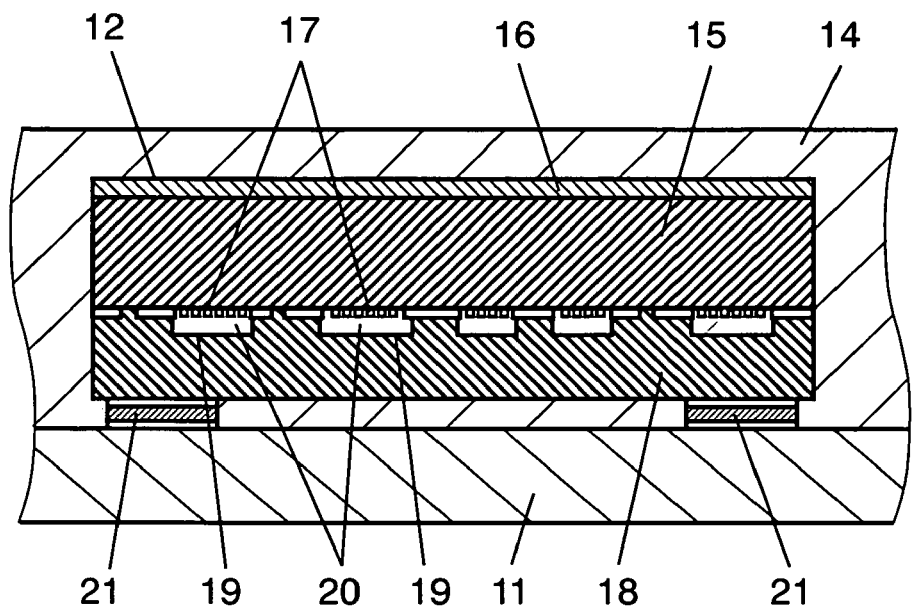
FIG. 3 shows a partial cross-sectional view of the electronic component package shown in FIG. 1.
Figure 4:
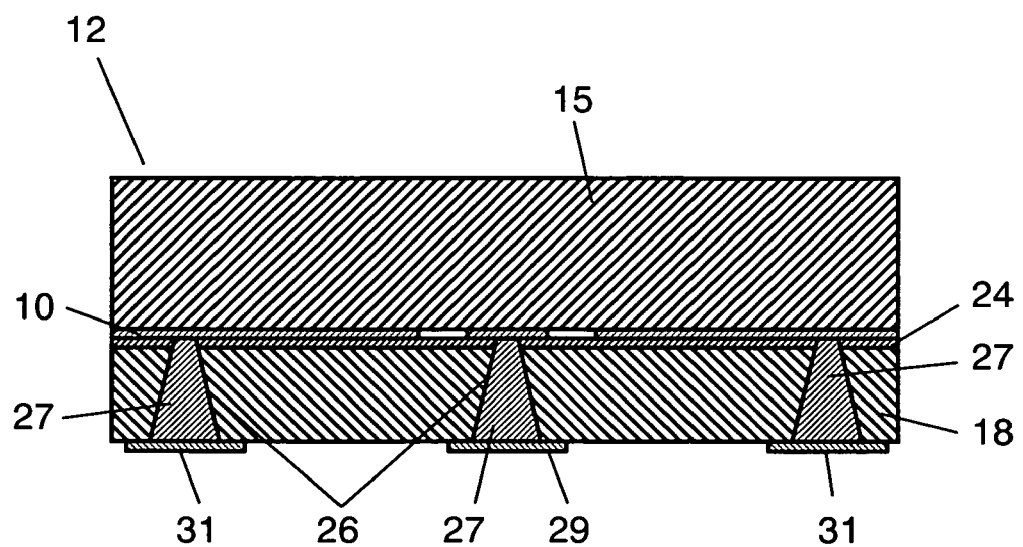
FIG. 4 shows a cross-sectional view of the electronic component included in the electronic component package shown in FIG. 1.
Figure 5:
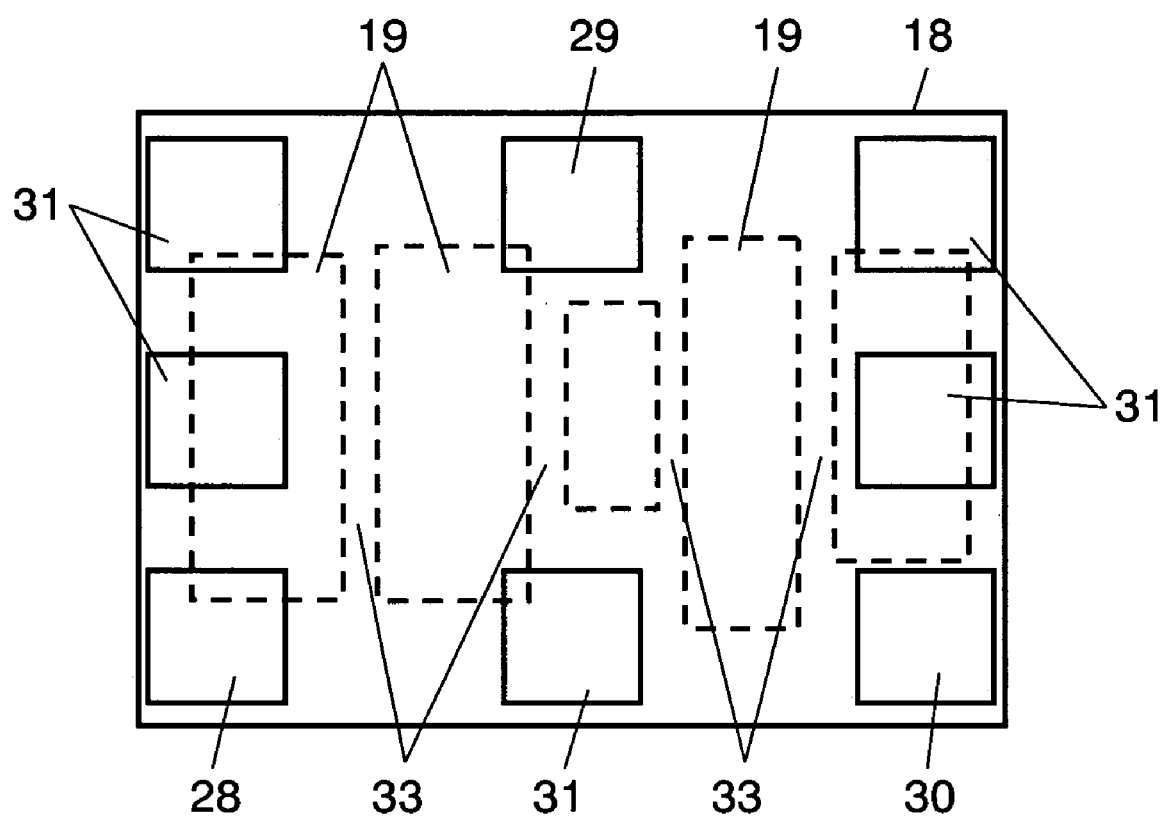
FIG. 5 shows a bottom view of a component-cover of the electronic component included in the electronic component package shown in FIG. 1.

FIG. 1 shows a transparent perspective view of the electronic component package according to the exemplary embodiment of the present invention. FIG. 2 shows a bottom view of a substrate of an electronic component included in the electronic component package shown in FIG. 1. FIG. 3 shows a cross-sectional view taken along the line 3-3 in FIG. 2 of the electronic component package shown in FIG. 1. FIG. 4 shows a cross-sectional view taken along the line 4-4 in FIG. 2 of the electronic component included in the electronic component package shown in FIG. 1. FIG. 5 shows a bottom view of a component-cover of the electronic component shown in FIG. 1. In the present exemplary embodiment, an electronic component package is described, where a surface acoustic wave device for duplexer (hereafter referred to "SAW duplexer") 12 is used as an example of an electronic component.

SAW duplexer 12 is disposed on mounting board (hereafter referred to "board") 11 together with other electronic components 13A to 13C and is covered by molding resin 14 as shown in FIG. 1. Additionally, SAW duplexer 12 is mounted on external terminals 21 disposed on board 11 shown in FIG. 3 via signal terminals: receiver terminal 28, antenna terminal 29, transmitter terminal 30 and ground terminals 31.

SAW duplexer 12 includes component-substrate (hereafter referred to "substrate") 15, protector 16, IDT electrode 17, adhesive portion 24 and component-cover (hereafter referred to "cover") 18 as shown in FIGS. 3 and 4. IDT electrode 17, as a device, is disposed on the bottom surface (a first surface) of substrate 15. Protector 16 is provided on the whole top surface (a second surface opposing the first surface) of substrate 15. Cover 18 covers the bottom surface of substrate 15 and IDT electrode 17. On the upper surface of cover 18, recessed areas 19 are provided at positions facing IDT electrodes 17. Recessed areas 19 form cavities 20 to act as oscillation spaces for surface acoustic waves that propagate between IDT electrodes 17.

On the bottom surface of cover 18, receiving terminal 28, antenna terminal 29, transmission terminal 30 and ground terminals 31 are disposed as extraction electrodes as shown in FIG. 5. IDT electrode 17 is connected to each terminal via connecting electrodes 10 formed on the same surface as IDT electrode 17 as shown in FIG. 2 and via external terminal connectors 27 that are formed inside of cover 18 and are connected to connecting electrodes 10 as shown in FIG. 4.

In the present exemplary embodiment, $LiTaO_3$ is used for the material of substrate 15, aluminum is used for IDT electrode 17 and silicon is used for cover 18, respectively. Epoxy resin including silicon oxide filler is used for the material of molding resin 14 and protector 16. The filler content in molding resin 14 is, for instance, at least 80 wt % and at most 90 wt %, and that in protector 16 is, for instance, 20 wt %. Substrate 15 can be formed also from other piezoelectric body such as $LiNbO_3$ or the like other than the aforementioned material, and IDT electrode 17 also from a metal other than aluminum. The material for cover 18 and adhesive portion 24 will be described in detail later.

Typical IDT electrode 17 has reflectors having short-circuit electrodes disposed laterally on both ends but the reflectors are omitted in FIG. 2. As to SAW duplexer 12, a plurality of regions are partitioned on wafer-like substrate 15 to form single SAW duplexer 12 in each region. FIG. 2 shows one of the regions.

Figure 6A:
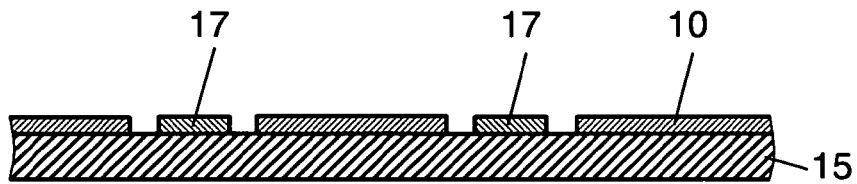
FIGS. 6A-6F, 7A and 7B show a manufacturing process of the electronic component according to the exemplary embodiment of the present invention.

Now, a manufacturing method of the electronic component package including SAW duplexer 12 is described. First, wafer-like substrate 15 is partitioned into a plurality of regions. FIG. 2 shows one of the regions as described above. Subsequently, aluminum is vaporized on the first surface of substrate 15 entirely by spattering. Then, patterns of IDT electrodes 17 and connecting electrodes 10 are formed by dry-etching as shown in FIG. 6A.

Figure 6B:
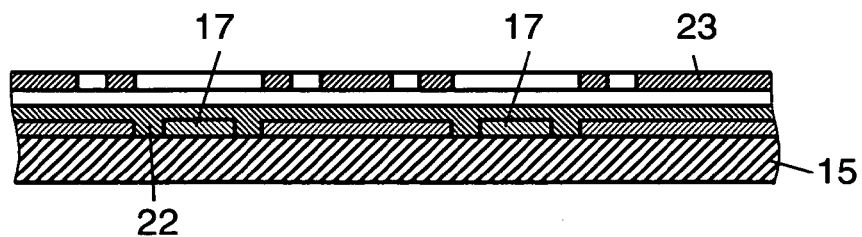
Figure 6C:
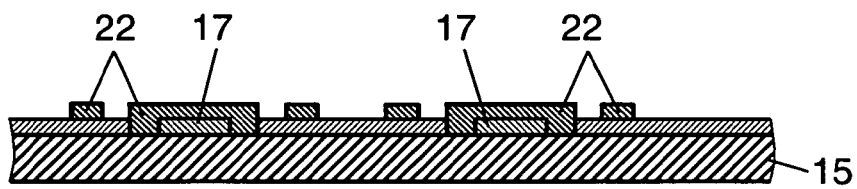

Next, photopolymer layer 22 is formed on substrate 15 entirely as shown in FIG. 6B. Portions other than corresponding to predetermined electrode patterns such as IDT electrodes 17 or the like are masked using mask 23 before substrate 15 is exposed and developed. By the processing, only non-masked portions of photopolymer 22 remain having hardened but masked portions do not remain as shown in FIG. 6C.

Figure 6D:
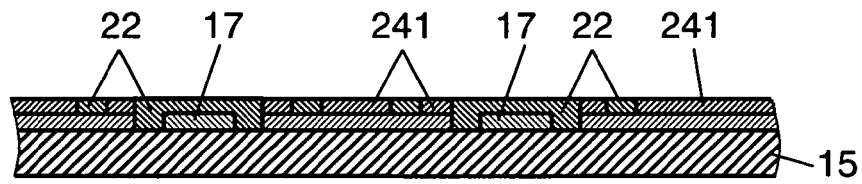
Figure 6E:
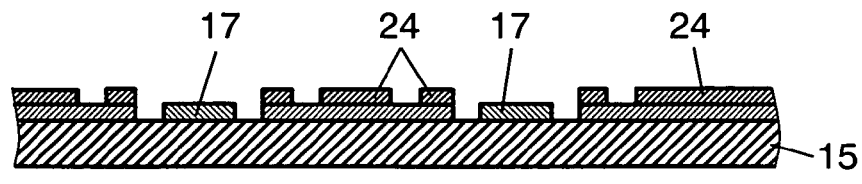

Subsequently $SiO_2$ 241, a material of adhesive portion 24, is sputtered on the first surface of substrate 15 entirely and substrate 15 is then immersed in a dissolving solution or the like to remove photopolymer 22 from substrate 15 as shown in FIG. 6D. Consequently, adhesive portions 24 composed of $SiO_2$ remain only on portions with no photopolymer layer 22, that is, portions other than the patterns of electrodes such as IDT electrode 17 or the like, as shown in FIG. 6E.

Figure 6F:
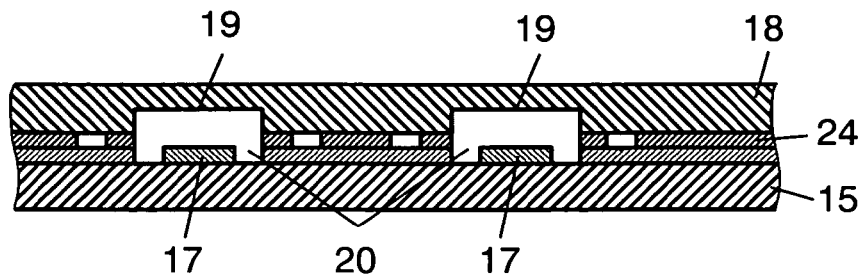

Meanwhile, recessed areas 19 are formed on the bottom surface of a silicon plate which is a material of cover 18 at certain areas facing IDT electrodes 17 by dry etching or sandblasting. Subsequently, an interatomic bond is formed between cover 18 and substrate 15 via adhesive portion 24 at room temperature in vacuum as shown in FIG. 6F. An aggregate of SAW duplexers 12 is thus manufactured. Cavity 20 formed between cover 18 and IDT electrode 17 by using recessed area 19 can prevent IDT electrode 17 from touching cover 18.

Figure 7A:
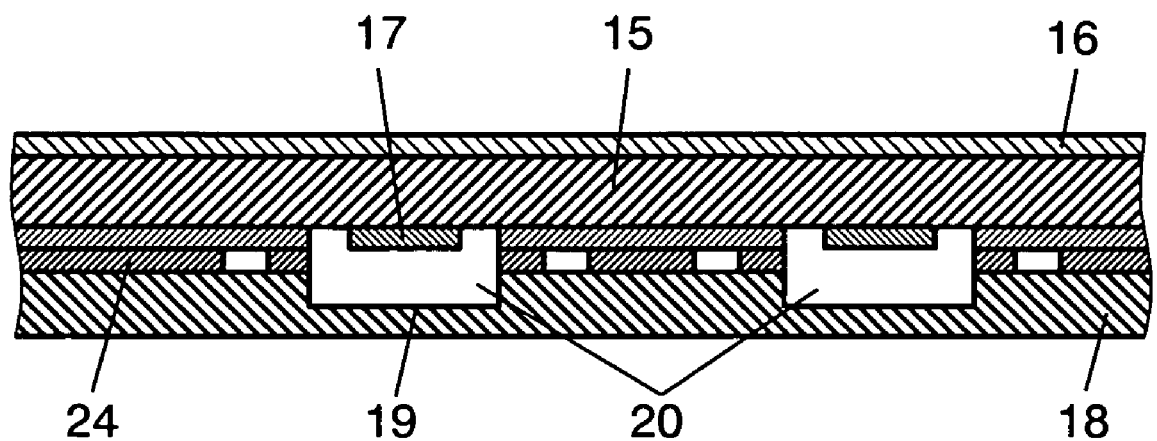

Next, turning over the aggregate of SAW duplexers 12, protector 16 is disposed on the second surface of substrate 15 as shown in FIG. 7A. At this time, protector 16 should preferably be pressed slightly to substrate 15 with a pressure of the order of 2 to 3 $kgf/cm^2$ so as to contact tightly.

Figure 7B:
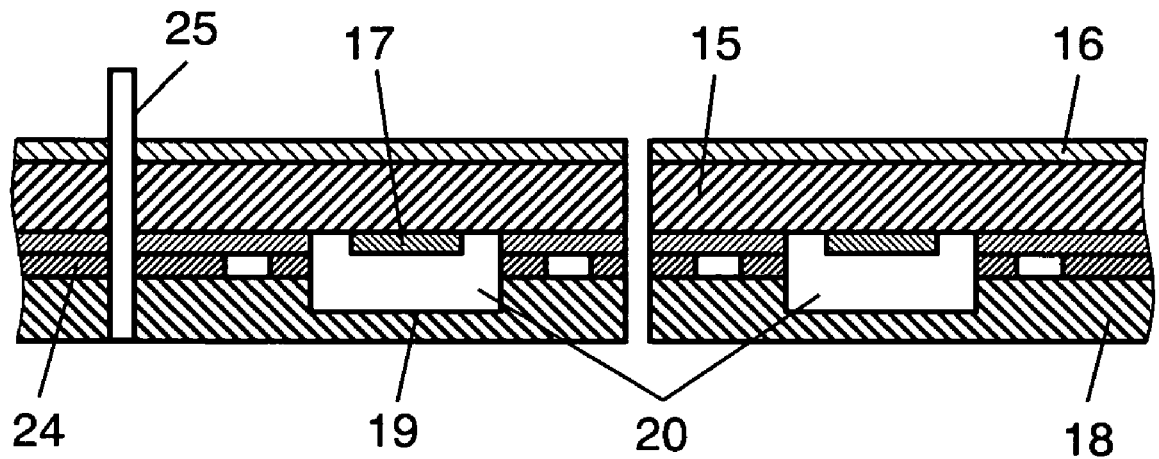

Next, the aggregate is cut down from protector 16 to cover 18 by using rotary blade 25 to separate it into individual electronic components as shown in FIG. 7B. A diamond abrasive of 8 to 15 μm mean grain size is coated on rotary blade 25. The aggregate is cut with rotary blade 25 at a rate of, for instance, approximately 10 mm per second with 5000 to 6000 r.p.m. of spindle speed.

Cover 18 is provided with through-hole 26 by dry etching as shown in FIG. 4. Titan (Ti), Nickel (Ni) and Gold (Au) are vaporized sequentially inside of through-holes 26 to form metal layers, and a solder is printed on the top of metal layers thereby forming external terminal connectors 27. Receiving terminal 28, antenna terminal 29 transmission terminal 30 and ground terminals 31 that are connected to each of external electrodes 21 of board 11 are formed on the bottom surface of each of external terminal connectors 27 as shown in FIGS. 4 and 5.

SAW duplexer 12 is mounted on board 11 via external electrodes 21 as shown in FIG. 1. Then, SAW duplexer 12 is put on a mold. Molding resin 14 molten by being heated up to the resin temperature of 175° C. is pressed into the mold at the pressure of 50 to 100 $kgf/cm^2$ and then cooled down before released from the mold.

Figure 12:
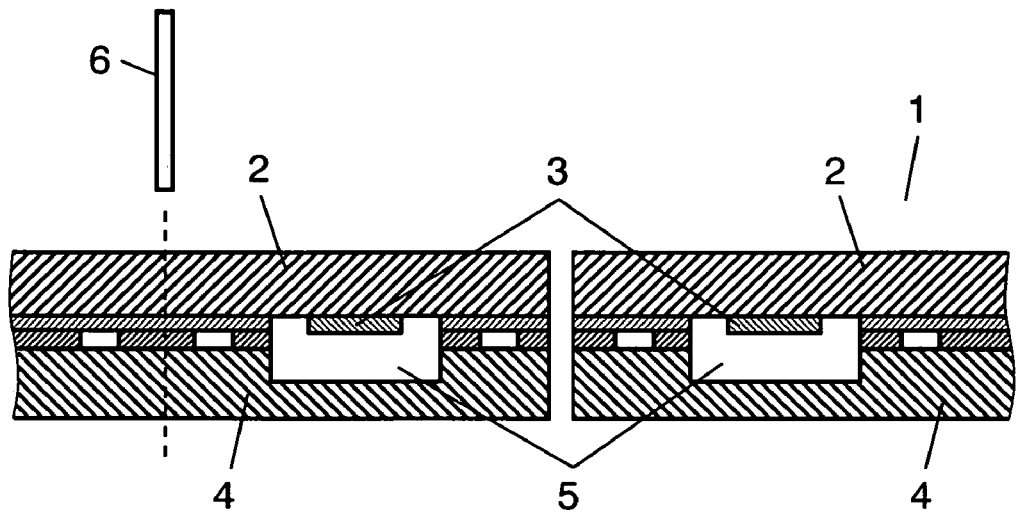
FIG. 12 shows a cross-sectional view of a conventional electronic component.
Figure 13:
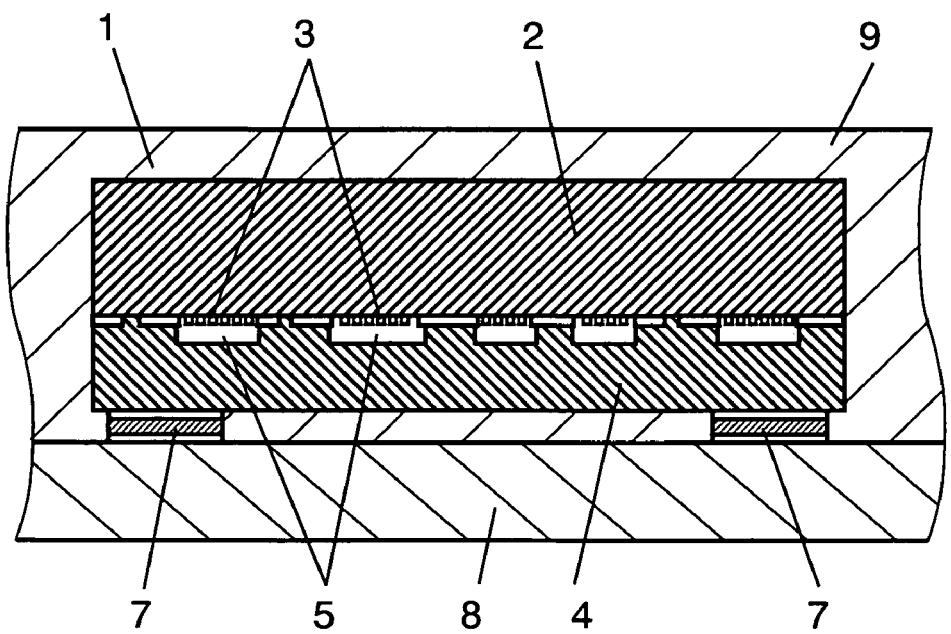
FIG. 13 shows a cross-sectional view of a conventional electronic component package.

The above configuration can decrease chipping in substrate 15 to prevent electronic components from being damaged, and thereby can improve the reliability under thermal loading. The reason is described below. When dicing a conventional aggregate with a substrate 2 side upward, rotary blade 6 having cut from substrate 2 into cover 4 comes out of substrate 2 with an open upside as described in FIG. 12. This tends to bend dicing surfaces of substrate 2 upward, resulting in the top surface of substrate 2 to chipping easily.

In the present exemplary embodiment, however, protector 16 composed of the epoxy resin including fillers is provided on the surface (the second surface) of substrate 15 opposite to the surface (the first surface) provided with IDT electrode 17. Such protector 16 has a large coefficient of elasticity (namely, protector 16 is hard), thereby substrate 15 can be prevented from bending in dicing substrate 15 by rotary blade 25. The configuration, therefore, brings decrease in occurrence of chippings in substrate 15 and can improve the reliability of the electronic component package against thermal loadings in the molding and subsequent heating processes.

In the present exemplary embodiment, although the epoxy resin including filler is used for protector 16, any other resin can be the alternative if the resin has good adhesion properties to substrate 15 and has a coefficient of elasticity of an order capable of preventing the bending of substrate 15. Here, a typical resin tape including no filler has a coefficient of elasticity of not higher than 5 GPa. Therefore, protector 16 should preferably have a coefficient of elasticity of not lower than 5 GPa. In addition, epoxy resin including excess filler would show a decrease in adhesion properties. Therefore, the content rate of the filler should desirably be at least 20 wt % and at most 50 wt %.

In the present exemplary embodiment, cover 18 is formed from a silicon material with comparatively larger coefficient of elasticity. Therefore, both cover 18 and protector 16 can prevent the bending of substrate 15 toward both sides in dicing substrate 15 by rotary blade 25. This can decrease chippings of substrate 15 more effectively.

Material for cover 18 is not limited to silicon only, but the material needs to have a coefficient of elasticity of an order high enough (namely, the material needs to be hard) to be capable of preventing substrate 15 from bending in the dicing process. In the present exemplary embodiment, the chipping is prevented effectively by using a silicon with much higher coefficient of elasticity (not lower than 100 GPa) compared with the coefficient of elasticity of a typical resin tape such as dicing sheet (not higher than 5 GPa).

To prevent cover 18 itself from chipping, the material for cover 18 should preferably have a low brittleness showing no cleavage breakage in dicing by rotary blade 25. From the above standpoint, glass with a coefficient of elasticity of the order of 70 GPa or epoxy resin including filler would be considered as very preferable materials other than silicon.

Figure 8:
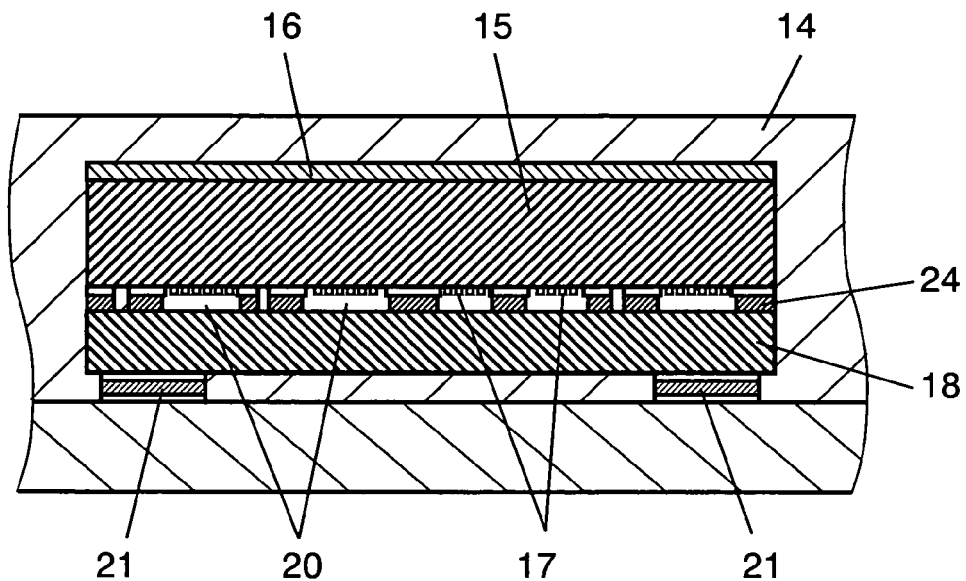
FIG. 8 shows a cross-sectional view of another electronic component package according to the exemplary embodiment of the present invention.
Figure 9:
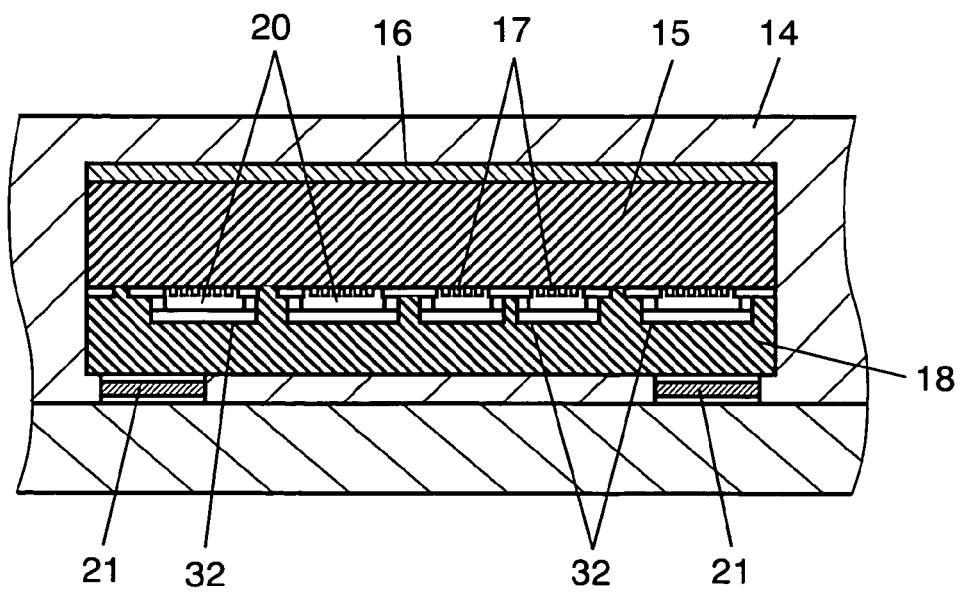
FIG. 9 shows a cross-sectional view of still another electronic component package according to the exemplary embodiment of the present invention.

In the present exemplary embodiment, recessed areas 19 are provided on cover 18 to form cavities 20 including IDT electrodes 17. Other than the above structure, planar cover 18 and adhesive portion 24 with increased thickness may also form cavity 20 as shown in the cross-sectional view of FIG. 8. In addition, cavity 20 can be sealed by device-cover 32 made of a resin or a metal as shown in the cross-sectional view of FIG. 9.

Furthermore, in the present exemplary embodiment, adhesive portion 24 to bond substrate 15 and cover 18 is formed from $SiO_2$. The coefficient of elasticity of approximately 60 GPa for $SiO_2$ is a notably high value compared with a coefficient of elasticity of general-use resin-made adhesive (not higher than 5 GPa). Therefore, adhesive portion 24 can also prevent the bending of substrate 15 in dicing substrate 15 by rotary blade 25, thus contributing to a further decrease in chipping of substrate 15.

On the other hand, when using a resin-made adhesive, adhesive portion 24 should be formed as thin as possible to reduce probability of chipping. Specifically, the thickness should preferably be not higher than 20 μm. Alternatively, cover 18 can be bonded to substrate 15 directly without using any adhesive. In this case, however, receiving terminal 28, antenna terminal 29, transmission terminal 30 and ground terminals 31 shown in FIG. 2 must be disposed outside the bonded part. That hampers the downsizing of SAW duplexer 12.

In the present exemplary embodiment, adhesive portion 24 provided on substrate 15 and composed of $SiO_2$ is bonded directly to cover 18 composed of silicon. That contributes to improve the characteristic for thermal loading of the complete SAW duplexer 12. This is because adhesive portion 24 hardly peels off from cover 18 when heated, since silicon forming cover 18 and $SiO_2$ forming adhesive portion 24 are materials of the same kind with a small difference in coefficient of thermal expansion between the two. SAW duplexer 12 has an improved reliability inheating processes such as reflow and heat-cycle consequently.

In the present exemplary embodiment, protector 16 is composed of a resin including filler and cover 18 sandwich substrate 15 from both top and bottom sides to cut the substrate integrally as described previously. The configuration can prevent the bending of substrate 15 and decrease the chipping. Consequently, the electronic component package has an improved thermal reliability. Additionally, the configuration can contribute to shorten the manufacturing process since protector 16 does not need to be peeled off after dicing like a conventional dicing sheet.

When cavities 20 are disposed, partition walls 33 produced between cavities 20 shown in FIG. 5 can disperse external stresses against cover 18. As a result, SAW duplexer 12 has a stronger resistance to external stress. Although boundaries between recessed areas 19 can be used as partition walls 33, a columnar body (not shown) composed of resin or the like disposed inside of cavity 20 can provide similar effects. In the exemplary embodiment, since protector 16 should preferably be pressed into place in the manufacturing process of the electronic component package, partition walls 33 are very effective in preventing the electronic component from being damaged.

Cavities 20 can be separated completely by partition walls 33 but adjacent cavities 20 may be partially connected by a tunnel-like communication path (not shown). In this case, the communication path can be disposed in cover 18, or can be disposed on the bottom surface of substrate 15, that is, the surface on which IDT electrode 17 is formed. In the case of disposing the communication path on the bottom surface of substrate 15, idle areas of the surface can be used where IDT electrode 17, connecting electrode 10, receiving terminal 28, antenna terminal 29, transmission terminal 30 and ground terminals 31 are not formed. The communication path can move the external stresses applied on cavity 20 partially to other cavities 20 smoothly, thus preventing the electronic component from being damaged by dispersing the external stresses.

Figure 10:
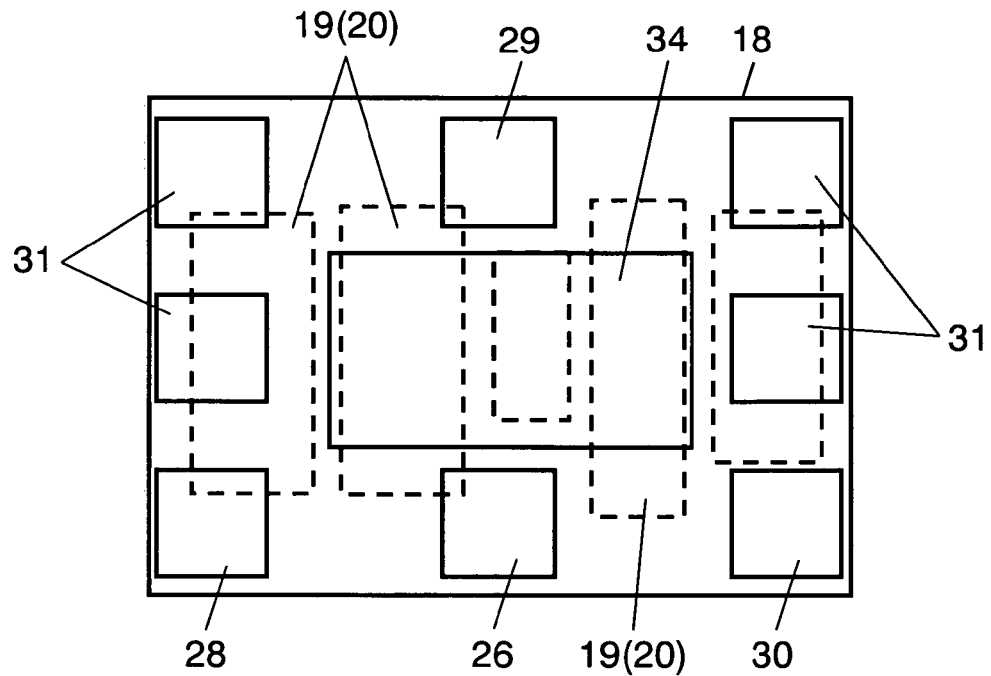
FIG. 10 shows a bottom view of another component-cover of the electronic component included in the electronic component package according to the exemplary embodiment of the present invention.

Next, a preferable shape of an external dummy electrode provided on the bottom surface of cover 18 is described. FIG. 10 shows a bottom view of another component-cover of an electronic component included in the electronic component package according to the present exemplary embodiment. The difference between this structure and the structure shown in FIG. 5 is that external dummy electrode 34 is disposed on a portion corresponding to the bottom of recessed areas 19 on the bottom surface of cover 18. Here, external dummy electrode 34 is an electrode which is not connected to receiving terminal 28, antenna terminal 29, transmission terminal 30 or ground terminals 31 disposed on the bottom surface of substrate 15. External dummy electrode 34 does not work as an electrode since it conducts no electricity.

As external dummy electrode 34 acts as a support between the electronic component and board 11 shown in FIG. 1, it disperses the external stresses applied on the electronic component, thus preventing damage to the electronic component. External dummy electrode 34 should desirably be disposed especially on an area corresponding to the bottom of cavities 20.

Molding resin 14 having penetrated between cover 18 and board 11 in the molding process has so high an inner pressure that in a conventional configuration sometimes cover 18 may happen to crack cavity 20. External dummy electrode 34 disposed on the bottom surface of cover 18 corresponding to the bottom of cavity 20 can reduce an amount of penetrating molding resin 14. Damage to the electronic component is consequently prevented.

As described in the present exemplary embodiment, since protector 16 should preferably be pressed to dispose in the manufacturing process of the electronic component package, the configuration is very effective to prevent the electronic component from being damaged.

Figure 11:
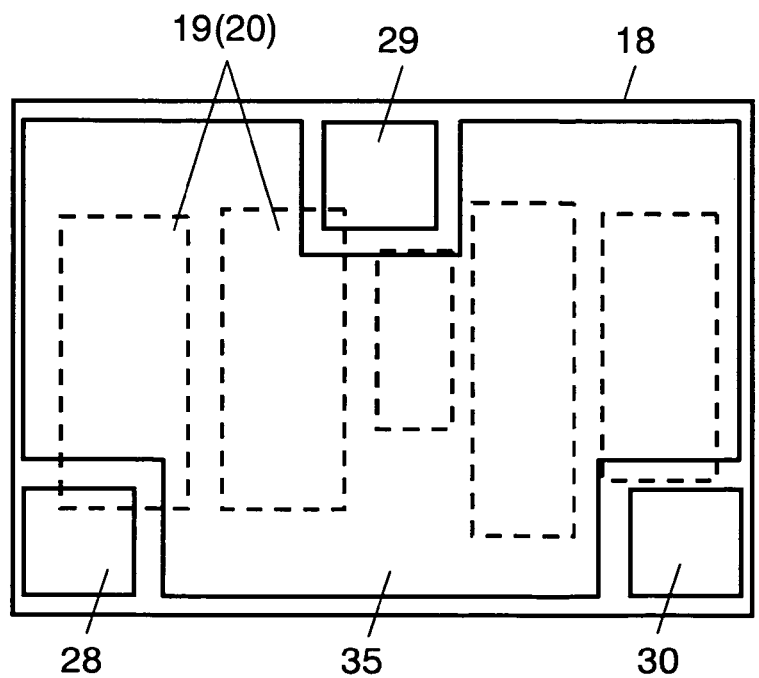
FIG. 11 shows a bottom view of still another component-cover of the electronic component included in the electronic component package according to the exemplary embodiment of the present invention.

A preferable shape for the ground terminal disposed on the bottom surface of cover 18 is described next. FIG. 11 shows a bottom view of still another component-cover of the electronic component included in the electronic component package according to the present exemplary embodiment. The difference between this structure and the structure shown in FIG. 5 is that ground electrode 35 is disposed on the bottom surface of cover 18 covering almost the entire bottom surface of cover 18 except receiving terminal 28, antenna terminal 29 and transmission terminal 30.

The configuration allows ground terminal 35 to act as a support to disperse the external stresses. Additionally, a gap between cover 18 and board 11 can be minimized noticeably thereby reducing the amount of penetrating molding resin 14. As described above, therefore, molding resin 14 can reduce the stress applied from underneath cover 18 significantly in the molding process. Damage to the electronic component is consequently prevented.

As described in the present exemplary embodiment, since protector 16 should preferably be pressed disposed in the manufacturing process of the electronic component package, the configuration can very effectively prevent the electronic component from being damaged.

The present exemplary embodiment is described using a SAW duplexer as an example of electronic components, but the present invention is not limited to this only. The present invention aims at preventing the problems caused by mounting before molding using material which tends to cause chipping easily in dicing. Therefore, the present invention can be suitable for a directly molded electronic component using materials which tend to cause chipping easily such as piezoelectric single crystal, piezoelectric ceramic or the like. For example, the invention can be suitable for a piezoelectric bulk-filter, a piezoelectric oscillator or the like.

As described above, the electronic component package of the present invention can reduce the occurrence of chipping in the dicing process, improve the thermal reliability and prevent the electronic component from being damaged. The invention is very useful for electronic component packages produced under heating processes such as molding, heat-cycle or the like.

What is claimed is:

1. An electronic component package comprising:
   a mounting board having a surface;
   an external electrode disposed on said surface of said mounting board;
   an electronic component connected to said mounting board via said external electrode, said electronic component having
   a component-substrate composed of a piezoelectric body and having a first surface, a second surface opposing said first surface, and an outer end surface,
   a device disposed on said first surface of said component-substrate,
   a component-cover made of silicon and having an outer end surface, said component-cover covering said device and said first surface of said component-substrate,
   an adhesive portion between said component-substrate and said component-cover, and
   a protector composed of a resin including filler and having an outer end surface, said protector covering said second surface of said component-substrate and having a coefficient of elasticity of at least 5 GPa,
   wherein said outer end surfaces of said component-substrate, said component-cover, and said protector are coplanar, and
   wherein said component-substrate and said component-cover are bonded via said adhesive portion by an interatomic bond; and
   a molding resin covering said electronic component.

2. The electronic component package according to claim 1, wherein said resin of said protector comprises epoxy resin, and a weight percentage of said filler is at least 20 wt % and at most 50 wt % of said protector.

3. The electronic component package according to claim 1, wherein said component-cover is made of one of silicon, glass, and epoxy resin including filler.

* * * * *